United States Patent
Panella et al.

(10) Patent No.: US 7,095,619 B2
(45) Date of Patent: Aug. 22, 2006

(54) POWER DELIVERY TO BASE OF PROCESSOR

(75) Inventors: Augusto P. Panella, Naperville, IL (US); John E. Lopata, Naperville, IL (US); James L. McGrath, Bloomingdale, IL (US); Arindum Dutta, Warrenville, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/383,028

(22) Filed: Feb. 25, 2003

(65) Prior Publication Data

US 2003/0198033 A1    Oct. 23, 2003

Related U.S. Application Data

(60) Provisional application No. 60/359,548, filed on Feb. 25, 2002.

(51) Int. Cl.
H05K 7/02    (2006.01)
H05K 7/06    (2006.01)
H05K 7/08    (2006.01)
H05K 7/10    (2006.01)

(52) U.S. Cl. .................. 361/760; 361/764; 361/785; 361/803

(58) Field of Classification Search ........ 361/760–764, 361/782–784, 803; 257/691–692, 700–706, 257/723–724
See application file for complete search history.

(56) References Cited

U.S. PATENT DOCUMENTS

| | | | |
|---|---|---|---|
| 5,481,436 A | 1/1996 | Werther | |
| 5,721,673 A | 2/1998 | Klein | |
| 5,734,555 A | 3/1998 | McMahon | |
| 6,046,911 A | 4/2000 | Dranchak et al. | |
| 6,069,793 A * | 5/2000 | Maruyama et al. | 361/687 |
| 6,303,989 B1 * | 10/2001 | Yasuho et al. | 257/706 |
| 6,366,467 B1 * | 4/2002 | Patel et al. | 361/760 |
| 6,703,697 B1 * | 3/2004 | Leahy et al. | 257/678 |
| 6,760,232 B1 * | 7/2004 | Smith et al. | 361/780 |
| 2003/0193791 A1 | 10/2003 | Panella et al. | |
| 2003/0194832 A1 | 10/2003 | Lopata et al. | |
| 2003/0197198 A1 | 10/2003 | Panella et al. | |
| 2003/0202330 A1 | 10/2003 | Lopata et al. | |

FOREIGN PATENT DOCUMENTS

WO    WO 8905570 A1    6/1989
WO    WO 0165344 A1    9/2001

OTHER PUBLICATIONS

International Search Report for International Application No. PCT/US03/06488, Feb. 16, 2004.

* cited by examiner

*Primary Examiner*—Tuan Dinh
(74) *Attorney, Agent, or Firm*—Thomas D. Paulius

(57) ABSTRACT

A processor mounted to a circuit board is provided with regulated voltage through lower-inductance circuit board traces by mounting a voltage regulator module for the processor, on the side of the circuit opposite to the processor. Current from the voltage regulator is provided to the processor by way of one or more conductors between the regulator and processor that extend through the circuit board from one side to the other. Inductance attributable to lead length is reduced by locating the voltage regulator close to its load. Circuit board space on the processor side of the circuit board is increased by moving the voltage regulator to the opposite side.

5 Claims, 7 Drawing Sheets

FIG. 1

(PRIOR ART)

FIG. 2

(PRIOR ART)

POWER DELIVERY TO BASE OF PROCESSOR

REFERENCE TO RELATED APPLICATIONS

This application claims priority of U.S. Provisional Patent Application Ser. No. 60/359,548, filed Feb. 25, 2002.

BACKGROUND OF THE INVENTION

The present invention relates generally to delivering power to computer processors, and more particularly to apparatus and methods for delivering power to micro and other processors to the base, and preferably the center of the processor.

The computer industry has seen a remarkable advancement over the years. Every few years, semiconductor companies are developing faster and more powerful chips, or processors, for use in desktop and notebook computers, as well as work stations. These more powerful processors have to operate at reduced voltages and higher currents. The need for supplying power to these processors presents design problems, especially in view of the high power requirements for processors, which may run as high as from about 200 amps to about 700 amps. One solution is to provide power supplies and/or conductive paths on the base or motherboard to which the processor is mounted. This is undesirable because the higher processor currents require the incorporation of large and thick copper traces in order to minimize voltage drop. This increases the cost of the motherboard. The traces must also be designed so as to provide very low loop inductance in order to stabilize voltage level in a few clock cycles when the processor emerges from a "sleep" state and enters a "computing" state. The use of additional copper and the need for specific circuit board design serves to increase the cost and complexity of using the base board to supply power.

A need therefore exists for a different way to provide power to these new processors which does not complicate the construction of the motherboard.

SUMMARY OF THE INVENTION

A general object of the present invention is to provide a means for improved power delivery.

Another object of the present invention is to provide a power delivery system for a processor in which power is delivered to center area of the processor.

A further object of the present invention is to provide a power delivery system for a processor in which the system includes a voltage regulator module ("VRM") positioned beneath the motherboard, i.e., on the side of the motherboard that is opposite the processor, the VRM having means for conducting power directly to the center of the processor.

A still further object of the present invention is to provide a VRM having a body portion with an opening for receiving the processor, the VRM housing a plurality of conductive traces to define a series of redundant power paths disposed around the processor perimeter, the VRM body portion including a first substrate and a second substrate spaced apart therefrom, the second substrate having a plurality of contacts that extend into the processor socket.

Yet another object of the present invention is to provide a processor power socket that includes a socket for attaching to the motherboard, a VRM with a first substrate for receiving a processor thereon, the first substrate having a plurality of power paths disposed therein for providing redundant power paths to the processor, the first substrate including a plurality of contacts, such as a pin, ball grid or land grid array, formed thereon so that the second substrate is not needed in the circuit path between the processor and the motherboard.

A yet further object of the present invention is to provide a VRM that has an opening with a plurality of leads disposed thereon around the opening, the opening receiving a processor an the leads extending from the top of the VRM into the top of the processor.

A still further object of the present invention is to provide a power delivery assembly for a processor for use with a motherboard which includes a socket for receiving a substrate therein, another substrate for receiving the processor and the substrate, and a VRM for attaching to the bottom of the motherboard, the VRM including a decoupling power socket having a plurality of conductive power lugs, or blades, that extend upwardly from the VRM through the motherboard, the socket and the two substrates to the center of the processor.

An additional object of the present invention is to provide a power delivery system as set forth above that utilizes only a single substrate to which the processor is mounted and which is received within the processor socket, the power contacts from the decoupling power socket extending through the motherboard, the socket and the first substrate to the center of the processor.

These and other objects; features with advantages of the present invention will become apparent from the following detailed description, taken in conjunction with the accompanying drawings.

BRIEF DESCRIPTION OF THE DRAWINGS

In the course of this detailed description, the reference will be frequently made to the attached drawings in which.

DETAILED DESCRIPTION OF THE PREFERRED EMBODIMENTS

Figure 1:
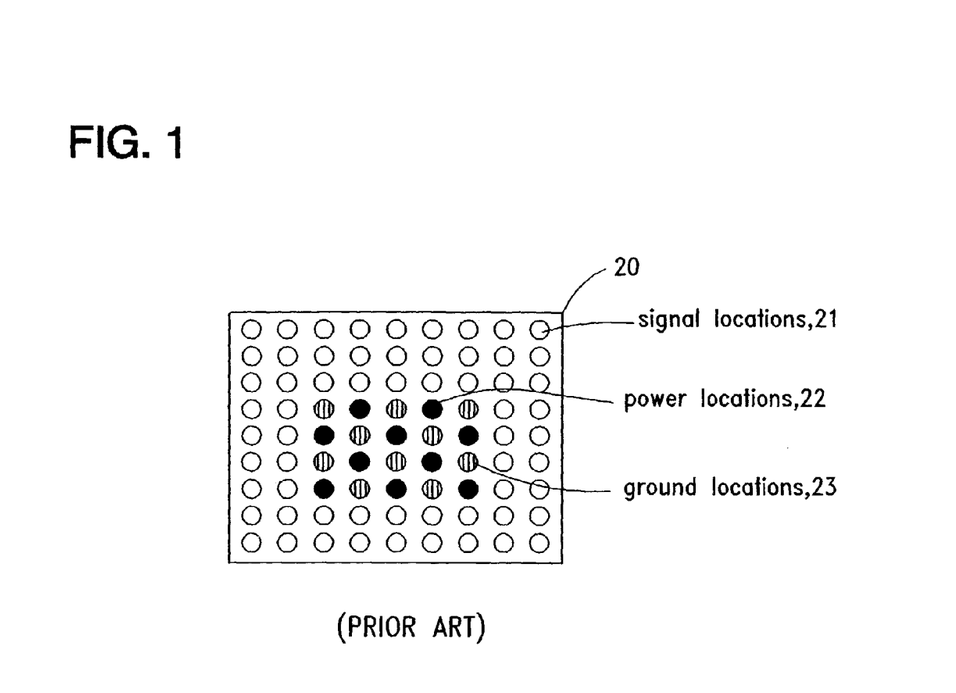
FIG. 1 is a schematic view of a typical pinout arrangement used for a processor.

FIG. 1 illustrates a typical pinout arrangement 20 as is found in an array-type processor package. This package would typically include a socket surrounding the pin arrangement 20 and a plurality of conductive contacts 21–23 located therein. Each of these contacts has two opposing ends, with one set of ends, that visible in FIG. 1 and being the top ends that protrude into the socket for contact to opposing traces, leads, balls, etc. On the bottom of the chip package, the other set of end that extend out from the socket. As seen in FIG. 1, the pinout locations include signal locations 21, power locations 22 and ground, or power return, locations 23. As can be seen in FIG. 1, there are a number of pins that are associated with the power aspect. The use of the present invention permits the elimination of a significant number of the power pins in such an array so that they may be freed for use with other signal aspects of the processor.

Figure 2:
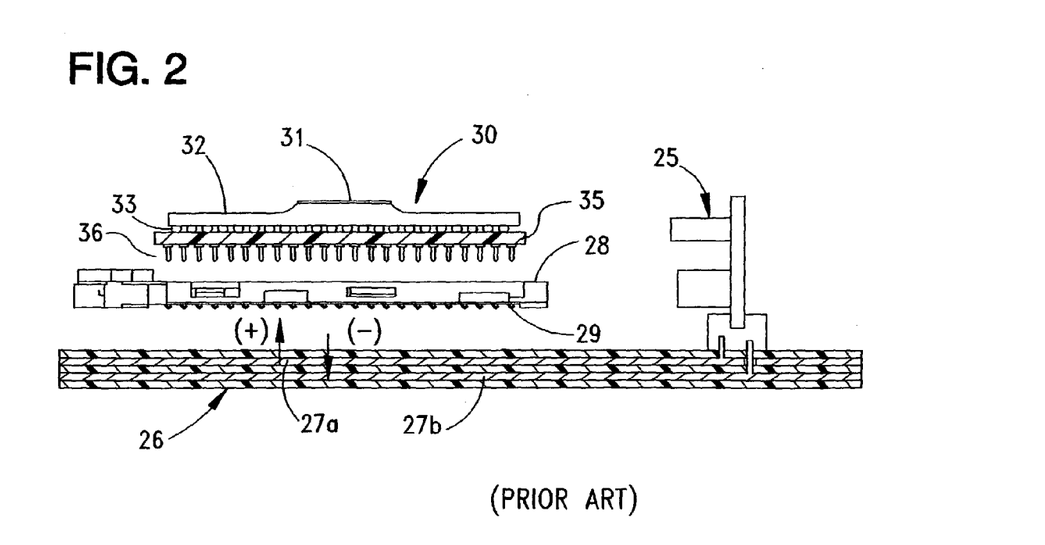
FIG. 2 is an elevational diagrammatic view of a typical prior art power delivery system to a processor accommodated in a PGA socket.

FIG. 2 illustrates a known power delivery system to a pin grid array ("PGA") in which a voltage regulator module ("VRM") 25 in mounted on a circuit board 26 and which is connected to one or more conductive traces 27a, 27b that are interconnected to the VRM and which typically will serve as "power out" and "power return" paths which are respectively indicated in FIG. 2 by the (+) and (−) designations. A socket 28 having a plurality of LGA contacts 29 may be mounted to the circuit board 26. A processor 30 includes a semiconductor die 31 mounted to a package 32 and may include contacts such as BGA contacts 33 disposed thereon that serve to connect the package 32 to a substrate, shown as a circuit board 36 which in turn has a series of conductive pins 36 thereon, typically arranged in the pattern of FIG. 1.

In such a prior art system, the VRM 25 takes up valuable space on the circuit board 26 and the use of conductive traces 27a, 27b within the circuit board 256 can increase the cost of the overall system.

Figure 3:
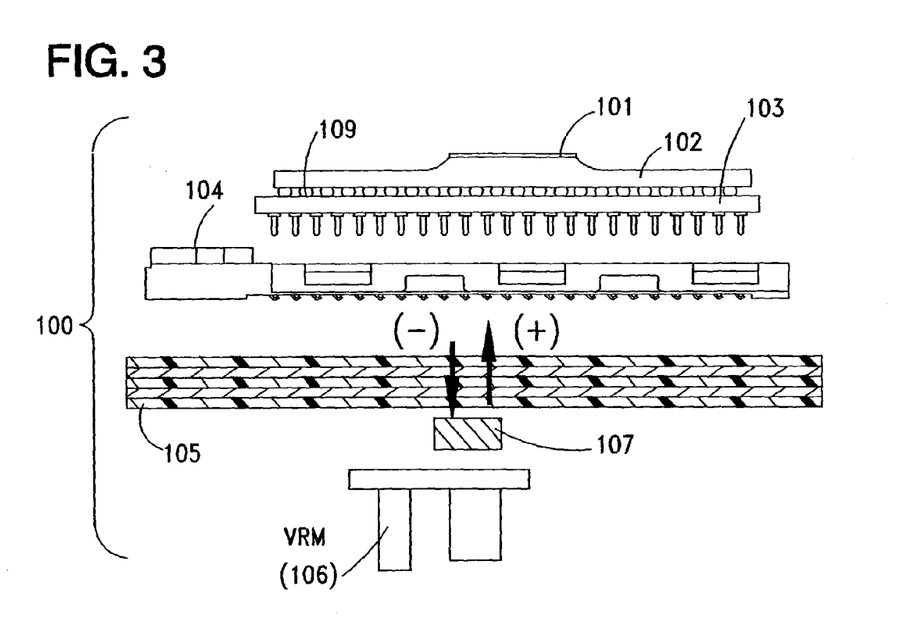
FIG. 3 is an exploded view of one embodiment of a power delivery system constructed in accordance with the principles of the present invention.

FIG. 3 is an exploded diagrammatic view of one general concept, or embodiment, of a power delivery system 100 constructed in accordance with the principles of the present invention. In this system, the semiconductor die 101 is mounted to a processor package 102 that in turn is mounted to a circuit board, or substrate, 103 which is received within a socket 104 that is mounted to a motherboard 105. The VRM 106 is mounted beneath the motherboard 105 and uses one or more conductors 107 to convey power from the VRM to the processor 101, 102 through the intervening sockets and circuit boards. In this manner, the VRM is removed from the area surrounding the circuit board to free up space on the upper surface of the board. The location of the VRM beneath the board shortens the current path to the processor.

Figures 4A, 4B:
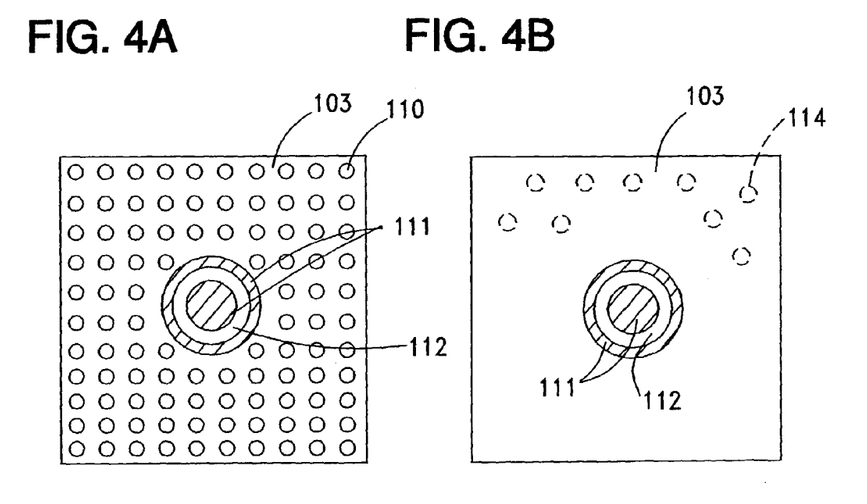
FIG. 4A is a plan view of a contact arrangement that may be utilized in the system of FIG. 3.
FIG. 4B is a plan view of another contact arrangement that may be utilized in the system of FIG. 3

FIGS. 4A and 4B illustrate two contact arrangements that may be used in the system 100 of FIG. 3. The arrangement includes traditional galvanic, i.e., "copper" contacts 110 for signal transmission and preferably two galvanic power contacts 111 i.e., power out and return that are separated by an intervening insulator 112. This arrangement will typically extend through the motherboard 105, socket 104 and substrate 103. FIG. 4B illustrates an arrangement that uses capacitively coupled contacts 114 that do not rely upon metal-to-metal contact, but which rely upon capacitance between the processor contacts 109 and conductive lands or pads (not shown) that are disposed on the underside of the substrate 103 on the motherboard 105. A more detailed description of this type of capacitive coupling arrangement may be found in applicant's copending U.S. patent application Ser. No. 09/548,940, filed Apr. 13, 2001 and U.S. Pat. No. 6,362,972, the disclosures of which are hereby incorporated by reference. The use of two single and relatively large power contacts advantageously reduces the number of power and ground pins required on the processor base, thereby freeing more space for use as signal pins, and increasing the density of the processor's signal applications.

It should be noted that the systems of the present invention provide desirable low inductance power paths to the processor rather than the high inductance paths of the prior art as exemplified in FIG. 2 that utilize the substrate. With the use of one or two power controls, or legs such as those shown in FIGS. 3, 4A and 4B, the number of power pins may be reduced from the arrangement of FIG. 1 so that more signal pins may be utilized on the processor and in the socket.

Figure 5:
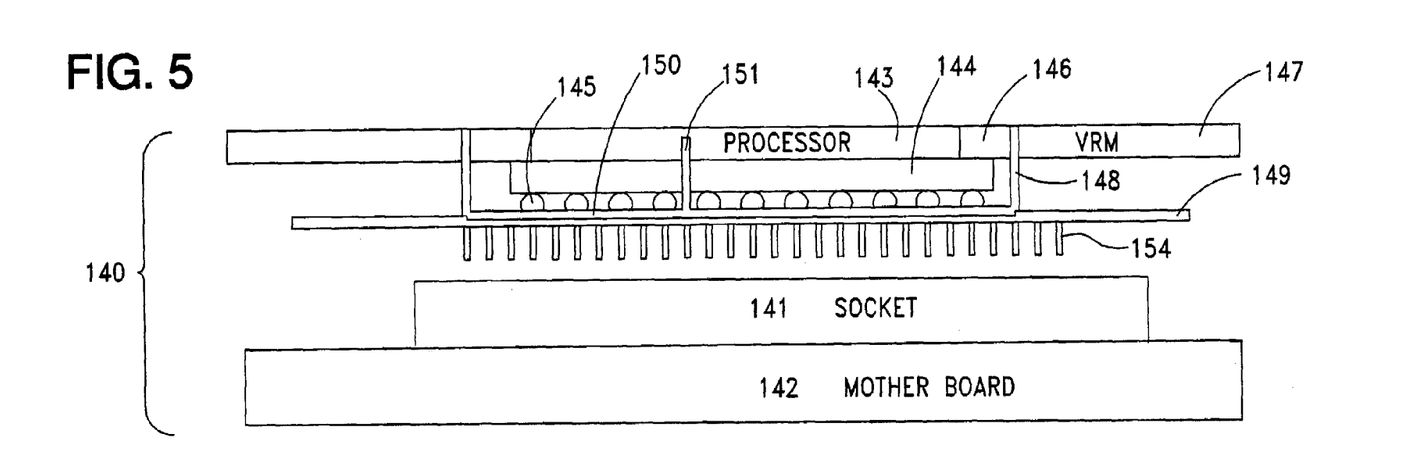
FIG. 5 is a schematic elevational view of another embodiment of a power delivery system of the present invention.

FIG. 5 schematically illustrates another embodiment of a power delivery system 140 of the invention. A processor socket 141 is mounted to the motherboard 142 and in designed to receive a processor package therein. The processor 143 is mounted to a first substrate 144 that has suitable conductive contacts associated therewith, such as a BGA 145. This assembly of the processor and first substrate is received within a recess, or opening, 146 of a VRM 147. The VRM 147 has a series of leads 148 that may be contacted to a second, pinned substrate 149. The leads 148 are connected to traces 150 disposed in or on the second substrate 149 which lead to a center lead, or leads 151 that extend up through the first substrate 144 into contact with the processor 143. These leads 151 may be galvanic or capacitive leads. Power is supplied to the processor 143 by these leads 151 from the VRM 147, thereby increasing the number of pins 154 on the substrate 149 that may be used as signal pins for mating with the socket 141.

Figure 6:
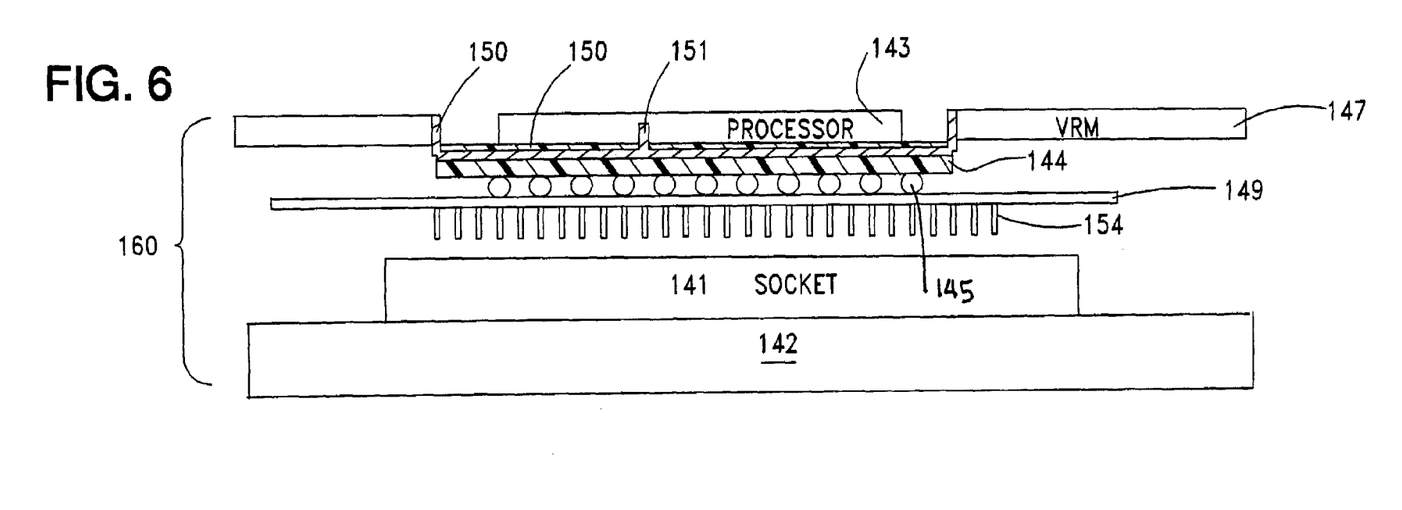
FIG. 6 is a schematic elevational view of another embodiment of a power delivery system of the present invention.

FIG. 6 illustrates another embodiment of a power delivery system 160 of the invention. This system differs from the system 140 of FIG. 5 in that the leads 151 of the VRM 147 mate with leads in the first substrate. In other words the first substrate 144 and the VRM (147) cooperate to provide power rather than the VRM and first and second substrates of the system 140. In both systems, the leads are provided in a redundant manner and their paths are preferably distributed around the processor 143. In this system 160, the second substrate 149 and the BGA (145) are removed from the power transmission path. The VRM and the substrates may be interfittingly formed together as a power "socket".

Figure 7:
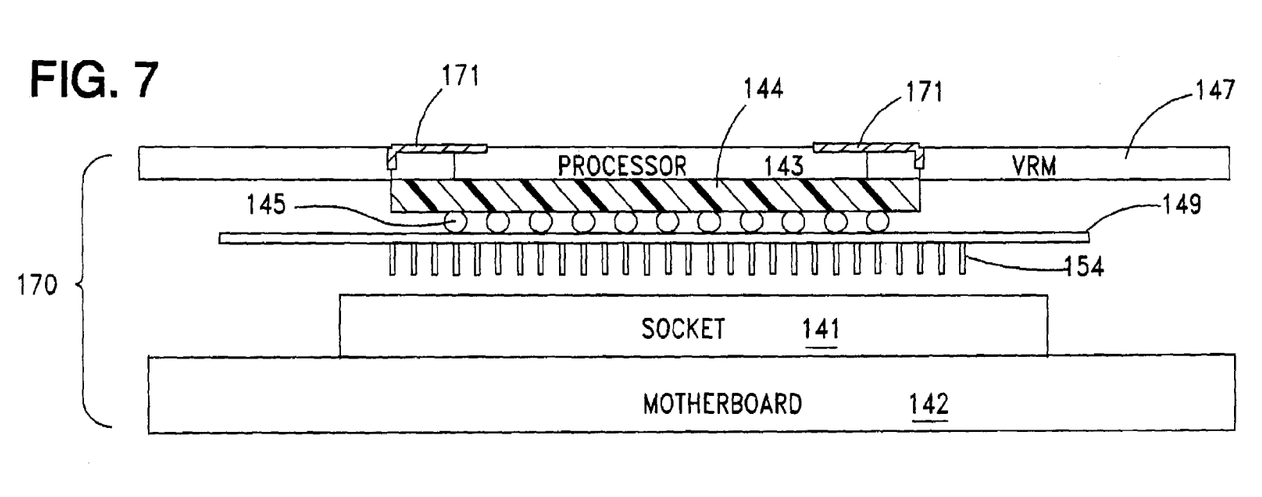
FIG. 7 is a schematic elevational view of another embodiment of a power delivery system of the present invention.

FIG. 7 illustrates another embodiment of a power delivery system 170 where the VRM 147 is provided with leads 171 that extend from it to the processor 143, and preferably along the top surface thereof, as illustrated. In this type of system, the two substrates 144, 149 and the BGA 145 are removed from the power delivery path.

Figure 8:
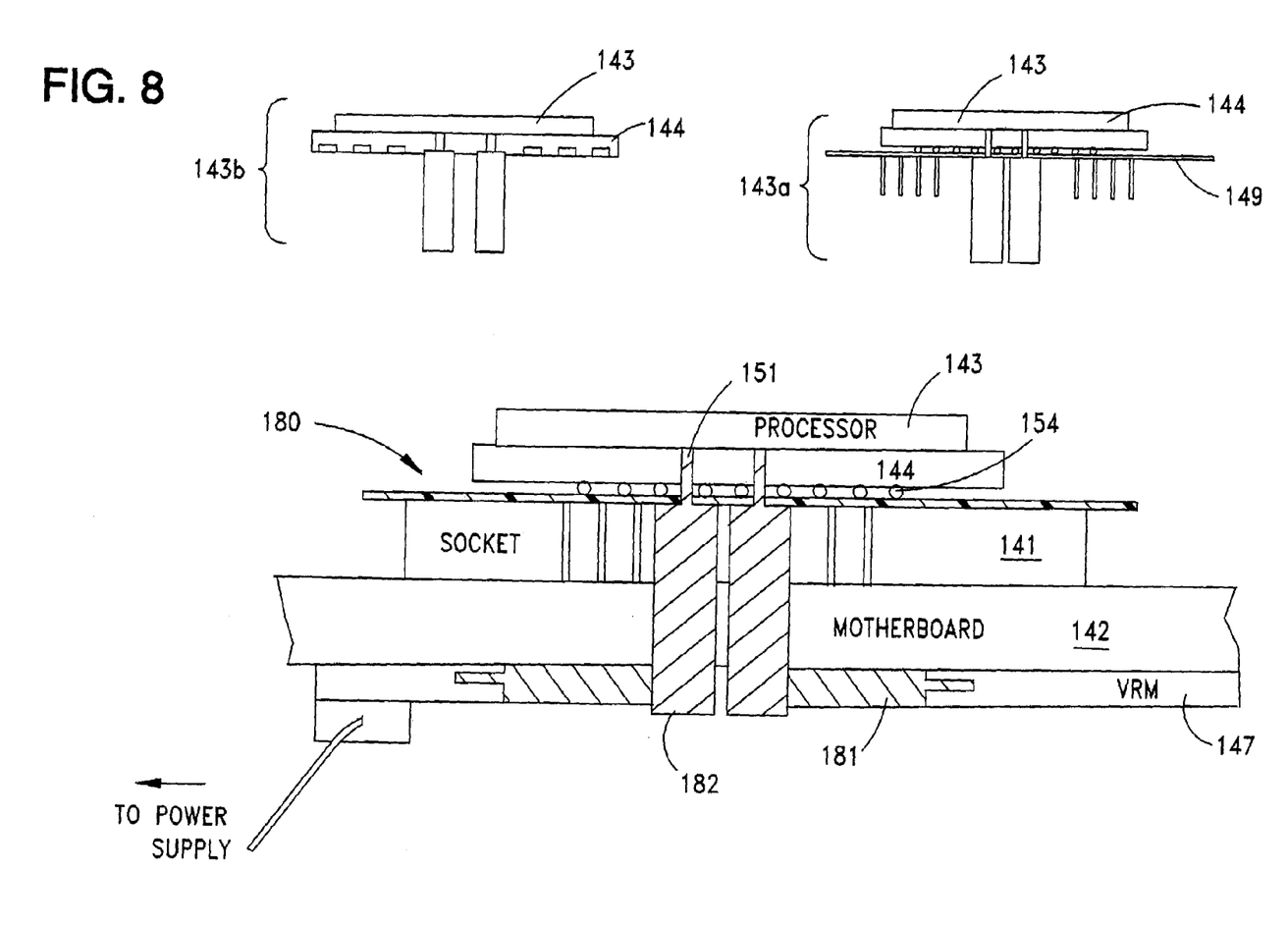
FIG. 8 is a schematic elevational view of another embodiment of a power delivery system of the present invention, but locating the VRM beneath the motherboard.

FIG. 8 illustrates another power delivery system 180 in which the VRM 147 is mounted beneath the motherboard 142. The VRM may include a power decoupling socket 181 of the types that are disclosed in applicant's copending patent application Ser. No. 10/255,376 filed Sep. 26, 2002, the disclosure of which is hereby incorporated by reference. In this system, the power leads 151 take the form of large lugs 182 which may, as illustrated in the insert view 143a, be formed as part of the processor package itself with the lugs 182 and surrounding pins depending downwardly therefrom which are received in respective openings in the motherboard 42 and the socket 141. Although the socket 141 shown in FIG. 8 is depicted as a PGA, it may include an LGA or other style of socket. The processor package may, as shown at 143*a*, include two substrates 144 and 149, or it may include as shown in insert view 143*b*, only a single substrate 144.

Figure 9:
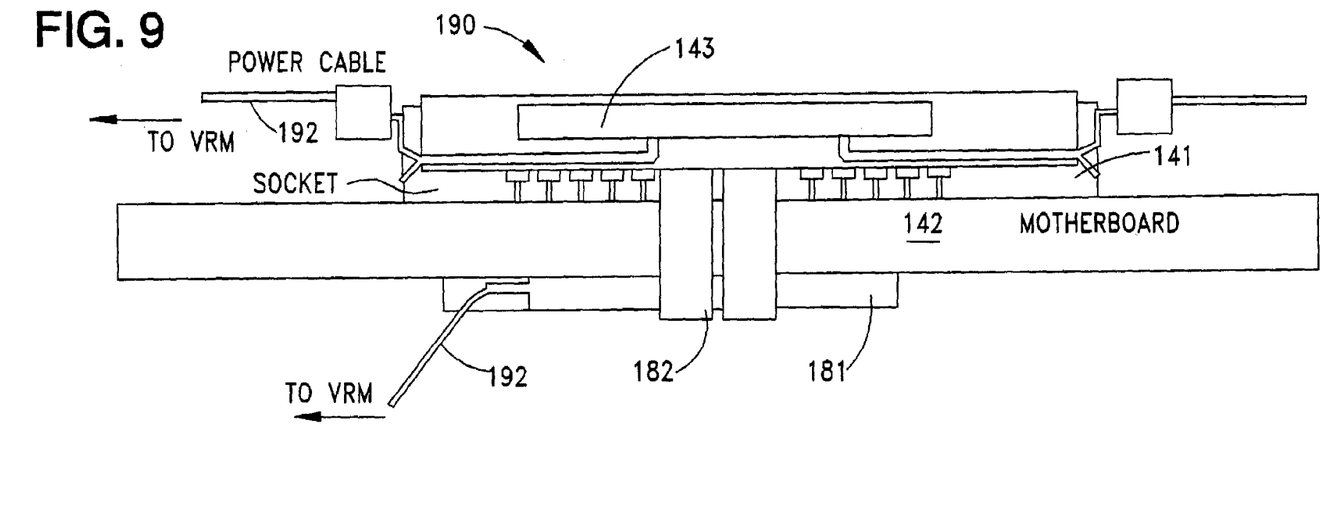
FIG. 9 is a schematic elevational view of a power delivery system of the present invention utilizing a power decoupling socket in combination with a remote VRM.

FIG. 9 illustrates another power delivery system 190 in which the VRM is remotely located away from the socket 141 and preferably on the motherboard 142. The power decoupling socket 181 is located beneath the motherboard and may receive its power from a lead, or cable 192, that leads to the VRM. The processor 143 may have the power lugs 182 formed with it as shown in 143*b* of FIG. 9. This illustrates a dual power supply configuration where power is supplied to the processor from both the top and the bottom of the motherboard.

Figure 10:
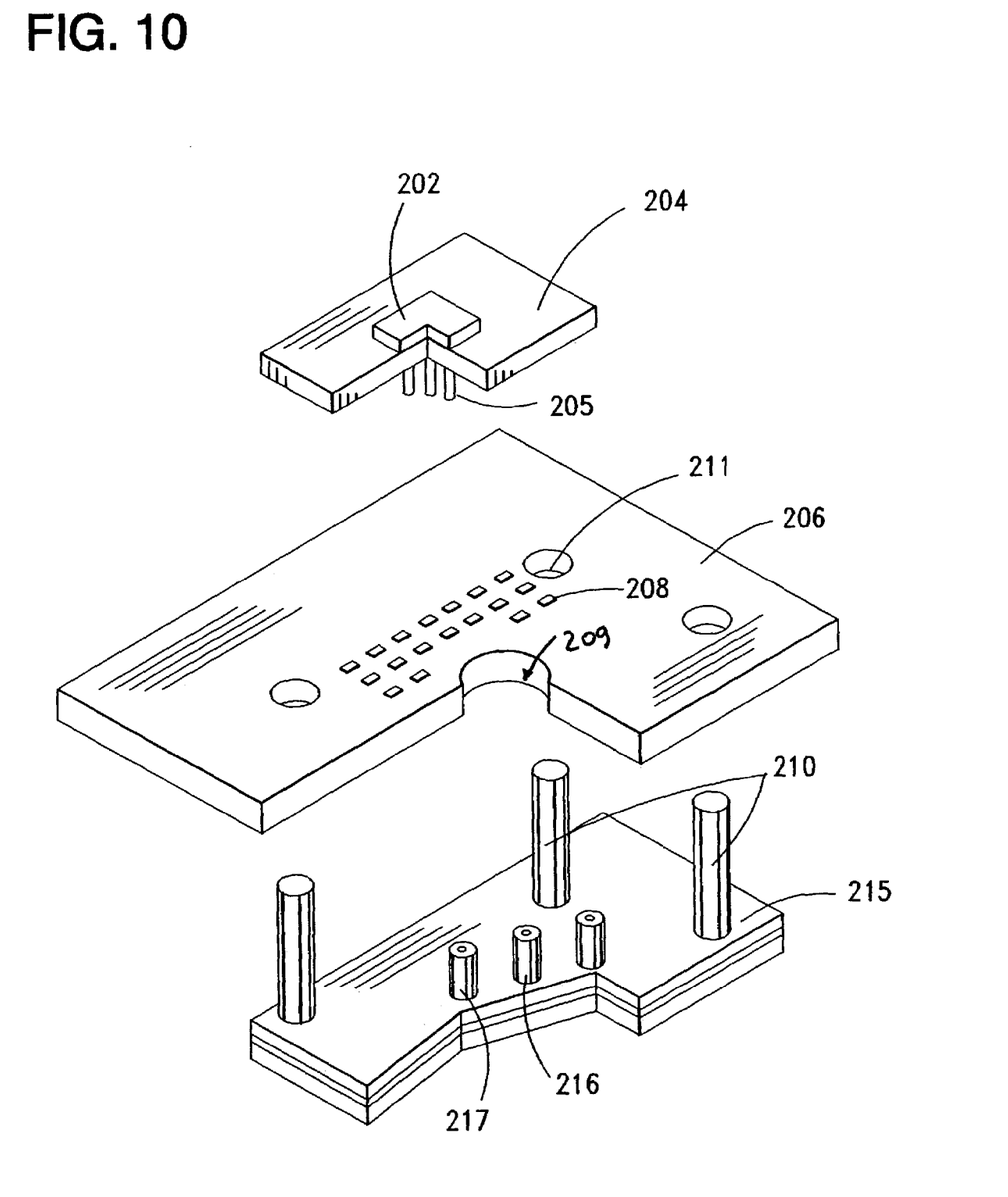
FIG. 10 is an exploded view of a power delivery system of the invention.

FIG. 10 illustrates another arrangement 200 for use with power delivery systems of the invention. In this arrangement, an LGA packaged processor 202 may be packaged in an LGA substrate 204 with LGA pads formed on its bottom surface and a select number of power pins 205 formed thereon. A second intervening substrate 206 with conductive lands 208 may have a general opening 209 formed in its center that accommodates the passage of the power pins 205 therethrough. A series of posts 210 may be provided that extend through the second substrate 206 via openings 211 therein and may be used to clamp the entire assembly together. These posts 210 fit through openings 211 and extend up from a LGA backing board 215. These posts 210 may be used to clamp the LGA package into the assembly as well as conduct current from a VRM (not shown). The LGA backing plate may have a sandwich-style construction with interleaved layers of conductive material (copper) and dielectric material with a series of center contacts 216 illustrated as conductive posts with center holes 217 that receive and engage the power pins 205. These center posts 216 are in turn connected to power out and return sources.

Figure 11:
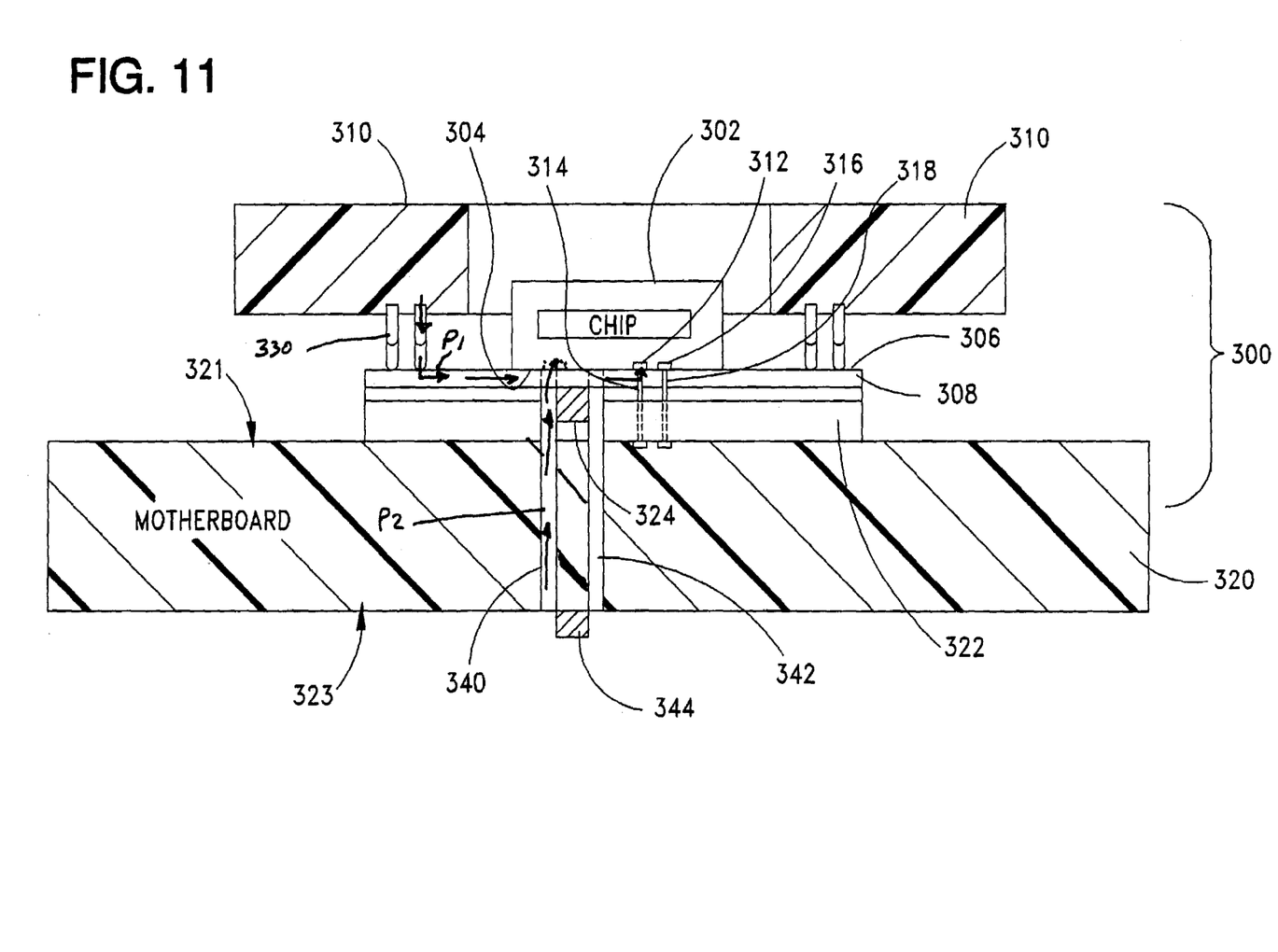
FIG. 11 is a schematic elevation view of a power delivery system assembly that includes an integrated circuit connector having an internally-mounted filter capacitor as well as filter capacitors mounted above and below the surface of a circuit board to which the assembly is mounted.

FIG. 11 illustrates an alternate embodiment of the invention in the form of a power delivery system assembly 300 that provides a regulated voltage to a integrated circuit package at reduced inductance along the power supply traces between a voltage regulator ("VRM") and an installed integrated circuit, or processor that is mounted to a motherboard. The power delivery system assembly 300 illustrated includes an integrated circuit connector of die 302; a substrate 308; and, a VRM 310. Electrical contacts on the bottom of the substrate 308 allow circuitry mounted on the substrate 308 (e.g., an integrated circuit within the connector 302 and the VRM) to be electrically connected to other circuitry (not shown) on a circuit board 320 to which the assembly 300 can be mounted. The VRM is shown mounted above the processor and it conveys power to the processor by way of contacts 330 that extend from the VRM to conductive traces on the substrate 308, which traces lead to the bottom of the processor connector 302 to define a first path for power transmission, P1 that is shown in bold in FIG. 11.

In FIG. 11, the first integrated circuit connector, or die 302, has a base, or lower face 304, that is adjacent to or which "faces" an upper or "first" side 306 of the underlying substrate 308. The substrate 308 is preferably made of an electrically non-conductive material such as, but not limited to, glass or phenolic resin, ceramic, et al. As is well-known in the art, the substrate 308 can include one or more conductive traces, i.e., metallic strips or bands, which are attached to a surface of the substrate 308 or which run along the interior of the substrate 308.

Inasmuch as integrated circuits may be fabricated with their power connections located on the package bottom, the integrated circuit connector 302 includes at least one electrical contact 312 that is electrically coupled to an electrical conductor 314 that extends through the substrate 308 to its lower face or surface. As shown in FIG. 11, the contacts are shown in touching or intimate contact. It will be understood, however, that such contact may be effected by capacitive coupling as is shown and described in the aforementioned application Ser. No. 09/548,940 and U.S. Pat. No. 6,362,972. A second electrical contact 316 on the integrated circuit connector 308 is electrically coupled to a second electrical conductor 318 through the substrate 308.

The electrical conductors 314 and 318 may also extend through the substrate 308 from the top surface to the bottom surface thereof so that they can be electrically connected to complementary conductors on a circuit board 320 via a second connector 322 that is sized and configured to accept electrical contacts that are on the second or lower face of the substrate 308 but which are not shown in FIG. 11. Such a second connector 322 preferably takes the form of a processor socket that is mounted to the motherboard 320 and connected to various circuits thereon. In a preferred embodiment, the first connector 302 includes at least one filter capacitor (not shown) that may be embedded with the connector as described in the aforementioned copending patent application, Ser. No. 10/255,376, and is electrically connected across the conductors 314 and 318, by way of conductive traces or the like, so as to provide smoothing of the voltage variations that occur when an integrated circuit within the connector transitions between a low-power operation mode (e.g., a "sleep" or "stand-by" state) to an active or high-power consumption mode state. Such a filter capacitor can be readily molded into or mounted into the connector 302 to provide additional power supply filtering where it is most effective, i.e., near to the load represented by an integrated circuit, such as a processor, in the socket 302.

A second connector 322 mounted on the circuit board 320 can also include at least one internal capacitor 324, the function of which is to provide power supply filtering for the voltage regulator module 310 that is mounted to the first or upper face of the substrate. The internal capacitor 324 provides filtering by virtue of its connection across the electrical traces or conductors that extend from the voltage regulator module 310 to the conductors 312 and 316 that extend through the substrate 308. Alternatively, the capacitor 324 may be located on the motherboard.

The capacitor located within the connector 302 and which is electrically connected across the output terminals of the voltage regulator module 310 and other capacitors across the power supply leads from a voltage regulator module provide enhanced power supply filtering and power storage. As is well-known in the electrical arts, increased filter capacitance provides more stable output voltages. Two capacitors will usually enable the provision of increased capacitance over that of a single capacitor to thereby provide enhanced filtering of power supply current and with minimal distributed inductance by being electrically close to the voltage regulator module as well as providing a parallel current path that has lower inductance, whereby the power supply voltage to an integrated circuit such as a processor, when mounted in the connector 302 will be provided with a more well-regulated supply voltage.

As shown in FIG. 11, the substrate 308 can be mechanically and electrically mounted to a connector 322 that is attached to a circuit board 320. The connector 322 includes electrical signal paths that includes electrical contacts (not shown) on its upper surface that receive and mate with corresponding contacts on the lower or bottom surface of the substrate 308. The electrical contacts on the connector 322 and the substrate 308 enable circuitry mounted on the substrate 308, such as an integrated circuit, or chip in the connector 302, to be electrically connected to other circuitry (not shown) on the circuit board 320.

The circuit board 320 includes at least two conductors, shown as power lugs or plated through-hole via 340 and 342. The power lugs/vias 340 and 342 extend completely through the circuit board 320 from the upper surface 321 to the lower surface 323 thereof where another filter capacitor 344 may be coupled across the power lugs/vias 340 and 342. These power lugs may be connected to the chip connector contacts 312, 316 or to the conductors 314, 316 in the substrate, as well as connect directly to the chip through the connector 302. The invention contemplates the use of at least one capacitor 324 or both capacitors 344 to assist in the provision of power to the processor. Where one capacitor is used, it is preferred to use it in the location of capacitor 324, close to the bottom of the processor in order to provide a low inductance power path. However, when two such capacitors 324, 344, are used, they are connected together in parallel as illustrated so as to take advantage of the reduced inductance that comes from a parallel connection.

By using the structure depicted in FIG. 11, a voltage regulator module 310 can be physically positioned close to an electronic device that requires regulated power, thereby minimizing distributed inductance associated with longer circuit board traces. In addition to providing regulated power and reduced inductance, the structure of FIG. 11 provides increased capacitance and therefore greater filtering of the output voltage from the VRM, further improving the stability of the voltage output from the VRM. The VRM providers power to the filtering and storage capacitors and charges them so that they may be discharged, or drawn upon by the processor, during certain operations of the processor, such as start up and others. The connection of the capacitors 324, 244 provides a second power path P2 along which power may be transmitted to the processor, and this second power path is arranged in parallel to the first power path P1 so that they provide a low inductance source of power. They also cooperate with the VRM to significantly reduce the lag time the processor incurs when drawing power.

In a preferred embodiment, the contacts to the integrated circuit are through the underside or base of the device. Accordingly, the connector 302 includes electrical contacts that provide such power to the underside or base-located power terminals of an integrated circuit. Also, in the preferred embodiment It will be understood that the invention may be embodied in other specific forms without departing from the spirit thereof. The present examples and embodiments, therefore, are to be considered in all respects as illustrative and not restrictive, and the invention is not to be limited to the details given herein.

What is claimed is:

1. An assembly for providing regulated voltage to a processor on a substrate having first and second sides, said assembly comprising:
   a processor mounted to a first side of said substrate;
   a connector mounting the processor to the substrate first side;
   a voltage regulator module, mounted to a second side of said substrate in opposition to the connector, the processor including a base that faces said first side of said substrate and which is received by the connector, the processor base having at least one power supply terminal that is proximate to a geometric center of said processor base;
   an electrical conductor, extending between said processor and said voltage regulator module through said substrate from said second side to said first side, said electrical conductor carrying substantially-regulated electric power from said voltage regulator module to said processor;
   said voltage regulator module also including a base which faces said substrate second side, said voltage regulator module further including an output power terminal on the voltage regulator base that is electrically coupled to the processor base power supply terminal, said conductor extending from said voltage regulator module base, through said substrate and connector to said processor base.

2. The assembly of claim 1 wherein said voltage regulator is mounted to said substrate on said second side at a location that is substantially directly opposite to said processor.

3. The assembly of claim 1, wherein said processor is attached to said substrate by one of the group consisting essentially of: a ball grid array (BGA), a land grid array (LGA) and a pin grid array (PGA).

4. The assembly of claim 1, wherein said voltage regulator module is attached to said substrate by one of the group consisting essentially of: a BGA; a LGA; and, a PGA.

5. The assembly of claim 1, wherein said substrate is a circuit board to which other electrical components are mounted.

* * * * *